United States Patent [19]

Balloni et al.

[11] Patent Number: 4,888,237

[45] Date of Patent: Dec. 19, 1989

[54] PROCESS FOR MANUFACTURING A METALLIZED POLYOLEFIN FILM AND RESULTING FILM

[75] Inventors: Ricardo Balloni, Fairport; Jay K. Keung, Macedon; Eldridge M. Mount, III, Fairport, all of N.Y.

[73] Assignee: Mobil Oil Corporation, New York, N.Y.

[21] Appl. No.: 156,127

[22] Filed: Feb. 16, 1988

[51] Int. Cl.$^4$ .................... C09J 7/02; B32B 15/08
[52] U.S. Cl. .................... 428/347; 427/223; 427/225; 428/349; 428/354; 428/461; 428/910; 428/913
[58] Field of Search ............ 428/461, 335, 910, 347, 428/349, 354, 913; 427/223, 224, 225

[56] References Cited

U.S. PATENT DOCUMENTS

| | | | |
|---|---|---|---|
| 2,632,921 | 3/1953 | Kreidl | 427/223 |
| 2,648,097 | 8/1953 | Kritchever | 427/223 |
| 3,028,622 | 4/1962 | Park | 427/223 |
| 3,255,034 | 6/1966 | Covington et al. | 427/223 |
| 3,347,697 | 10/1967 | Gmitro | 427/223 |
| 3,375,126 | 3/1968 | Nagel | 427/224 |
| 3,431,135 | 3/1969 | Keane et al. | 428/461 X |
| 3,674,536 | 7/1972 | Khelghatian et al. | 428/461 |
| 4,211,811 | 7/1980 | Bordini et al. | 428/461 X |
| 4,239,827 | 12/1980 | Notaro | 428/461 X |
| 4,345,005 | 8/1982 | All et al. | 428/910 X |
| 4,357,383 | 11/1982 | Howden et al. | 428/335 X |
| 4,508,786 | 4/1985 | Ishibashi et al. | 428/461 |
| 4,522,887 | 6/1985 | Koebisu et al. | 428/910 X |
| 4,604,322 | 8/1986 | Reid | 428/461 X |

Primary Examiner—Thomas J. Herbert
Attorney, Agent, or Firm—Alexander J. McKillop; Charles J. Speciale

[57] ABSTRACT

A process for manufacturing a metallized polymeric film to provide a structure possessing high metal-to-film adhesion and little, if any, tendency toward metal fracture is disclosed. In one embodiment of the process, at least one polyolefin layer is provided to a film which includes a substantially isotactic polymer having a degree of atacticity of no more than about 6%. The isotactic component is preferably polypropylene homopolymer. Other components include up to about 34% of an adhesive-promoting component which can be a $C_2$–$C_4$ polymer, including homo-, co-, and terpolymers having $C_2$–$C_4$ carbon chains, and a second isotactic polymer having a degree of atacticity of from about 6% to about 15%. The surface of the polyolefin layer is subjected to flame treatment followed by vacuum metallization of this surface (preferably with aluminum).

14 Claims, No Drawings

PROCESS FOR MANUFACTURING A METALLIZED POLYOLEFIN FILM AND RESULTING FILM

BACKGROUND OF THE INVENTION

This invention relates to a process for manufacturing a metallized polymeric film as well as the film resulting from the process. More particularly, the invention provides a metallized, e.g., aluminized, polymeric film wherein the metal-adherent surface is a flame treated crystalline polyolefin such as isotactic polypropylene containing from 0 to about 50 weight percent of non-crystalline polyolefin component(s).

The metallization of polymeric films for aesthetic and/or functional purposes is a well developed technology.

U.S Pat. No. 3,431,135 describes the vacuum metallizing of polyethylene terephthalate film in which the film is first subjected to a reducing flame to improve its affinity for the subsequently applied metal. This procedure is said to result in a level of bond strength between the film and metal which is higher than that resulting from treatment of the film surface by neutral and oxidizing flame treatment or electrical discharge treatment.

U.S. Pat. No. 3,674,536 describes a method for metallizing a crystalline polyolefin film surface employing established vacuum metallizing techniques. Adhesion of the metal to the film substrate is said to be improved by incorporating a coumarone-indene resin into the metal-adherent resin.

U.S. Pat. No. 4,211,811 describes the vacuum metallizing of an oriented, i.e., stretched, crystalline polyolefin film whose surface has been treated by corona discharge to improve its receptivity for the subsequently applied metal film. Similar procedures are described in U.S. Pat. Nos. 4,345,005 and 4,604,322, the metal-adherent film surface being fabricated from an ethylene-propylene copolymer.

U.S. Pat. No. 4,357,383 described a multiple-layer metallized film comprising a polyolefin copolymer substrate layer and a metal-adherent random ethylene copolymer layer for improved metal adhesion.

U.S. Pat. No. 4,508,786 describes a corona discharge-treated vacuum metallized resin film wherein the resin is obtained by blending a crystalline propylene-alpha-olefin copolymer containing 70% by weight or more of propylene component and having a crystalline m.p. of 150° C. or lower, with a high density polyethylene having a density of 0.940 g/cm$^3$ or higher, in blending ratios of 96 to 80% by weight of the copolymer and 4 to 20% by weight of the polyethylene, the ratio of the melt flow rate of the polyethylene to that of the copolymer being equal to or greater than 0.7.

U.S. Pat. No. 4,522,887 describes a laminate film prepared by laminating at least one surface of a biaxially oriented polypropylene film (A) with an olefin polymer film (B) containing from 10 to 50% by weight of an ethylene component with the balance mainly comprising a propylene component. Olefin polymer film (B) possesses at least three peaks in the melting curve within the range of from 120° to 165° C. and a surface roughness Ra of from 0.2 to 1.5 microns. The film is said to possess excellent adhesion to metallized layers and to paper. In addition to various vacuum metallizing techniques, other metallization procedures are disclosed as suitable, i.e, sputtering and ion plating. The preferred metallization procedure includes activation of the film surface to which the metal is to be applied by a treatment such as corona discharge, acid or flame.

Treatment of a polymer film surface by flame to improve the adherence of a subsequently applied coating is a well known type of operation in the coated polymer film art. Illustrative flame treatment techniques are described, inter alia, in U.S. Pat. Nos. 2,632,921; 2,648,097; 3,028,622; 3,255,034; 3,347,697; 3,375,126; and 4,239,827.

Heretofore, it has not been recognized that a crystalline polyolefin film surface can be flame treated prior to vacuum metallization to provide a level of film-metal adherence which is significantly greater than that achieved by corona discharge treatment of such a surface prior to metallization or by flame treatment of an essentially non-crystalline polyolefin homopolymer/copolymer surface.

SUMMARY OF THE INVENTION

In accordance with the present invention a metallized flexible polymeric film and process for making same is provided which includes at least one layer having at least one substantially isotactic polymeric component, such as isotactic polypropylene homopolymer, having a degree of atacticity of no more than about 6%. The at least one layer is surface treated by exposure to a flame prior to subjecting it to metallization in order to significantly enhance the adhesion of subsequently applied metal to the surface. Finally, the metal, which is preferably aluminum, can be applied to the surface such as under vacuum metallizing conditions.

The polymeric film can also include a core layer of primarily isotactic polymer such as isotactic polypropylene homopolymer, and a further heat sealable layer in direct contact with the core layer. The at least one substantially isotactic polymeric layer can also include an adhesion-promoting component such as a $C_2$–$C_4$ polymer which can be included in an amount of not more than about 34% by weight of the composition of that layer. The $C_2$–$C_4$ polymer includes homo-, co-, and terpolymers having $C_2$–$C_4$ carbon chains. The metallizing layer can also include a second substantially isotactic homopolymer, such as isotactic polypropylene homopolymer, which has a degree of atacticity from about 6% to about 15% by weight of the composition of said layer. The second homopolymer is present in an amount of up to about 50% by weight of that layer. In one embodiment, the metallizing layer includes all three ingredients, provided that the substantially isotactic homopolymer with a degree of atacticity of not more than about 6% is present in an amount of at least about 50% by weight of the composition of that layer.

The metal receiving surface preferably possesses a gloss of at least about 75%, and preferably 85%, at 45 .

The process for making the polymeric film can also include orientation by stretching prior to subjecting the film to flame treatment and metallization. The flame treatment of the metal receiving film surface can impart an energy density of from about 30 to about 60 dynes per centimeter, and preferably imparts and energy density of from about 35 to about 55 dynes per centimeter.

The resulting film possesses excellent metal to resin adherence as well as a high degree of resistance to metal fracture, especially in extrusion lamination with polyethylene. As such, the metallized film of this invention is particularly useful in flexible packaging applications to provide enhanced moisture barrier protection as well as an attractive appearance for the packaged goods.

DESCRIPTION OF THE PREFERRED EMBODIMENTS

The metallized film of the present invention is provided as a single layer or multilayer, i.e., laminate, film in which the metal-adherent film surface is a polyolefin containing at least about 60 weight percent homopolymer and preferably at least about 80 weight percent homopolymer. The polyolefin must have no more than 6% atacticity. In general, the metal-receiving layer should on the average contain no more than about 10 weight percent of xylene solubles measured in accordance with FDA CFR Reg. 177.1520(c) 1.1. In addition, the metal-receiving layer must be relatively glossy, e.g., exhibiting at least about 75% gloss, and preferably at least about 85% gloss, at 45° in accordance with ASTM-D2457. Advantageously, the polyolefin metal-receiving surface is fabricated from a polypropylene homopolymer which is from about 80-100% isotactic, and preferably from about 95-96% isotactic. When blends of polypropylene are employed, the blend of polypropylenes preferably includes an second isotactic homopolymer having a degree of atacticity of from about 6% to about 15%. The preferred polypropylene homopolymer possesses a melt index of from about 2 to about 10 grams/10 minutes, and preferably a melt index of from about 3.5 to about 6 grams/10 minutes. The balance of the polyolefin metal-receiving layer, if any, can be a copolymer such as ethylene-propylene copolymer, ethylene-propylene-butene-1 terpolymer, and the like.

In a preferred embodiment of the metallized film of the present invention, the film is provided as a laminate structure in which a core layer of substantially isotactic polypropylene is surfaced on one side with a metal-receiving layer comprising the same isotactic polypropylene of the core layer or a blend of such polypropylene with no more than about 34 weight percent, and preferably no more than about 20 weight percent polyolefin copolymers and surfaced on the other side with a layer of heat sealable resin.

Suitable heat sealable resins include blends of poly(1-butene) and a copolymer of ethylene or propylene and a higher olefin as disclosed in U.S. Pat. No. 4,275,120, a blend comprising a copolymer of ethylene and a higher olefin and a different copolymer of higher olefins as disclosed in U.S. Pat. No. 4,297,411, an interpolymer of propylene and two different higher alpha-olefins, a copolymer of butene-1 and a higher alphaolefin or an interpolymer of ethylene, propylene and a higher olefin as disclosed in U.S. Pat. No. 4,339,497, heat-sealable acrylic resin on a primer layer as disclosed in U.S. Pat. No. 4,439,493 and vinylidene chloride polymer on a primer layer as disclosed in U.S. Pat. No. 4,495,027.

The multilayer film is advantageously fabricated by known and conventional coextrusion procedures. In a typical multilayer film structure, the coextruded laminate can have a total thickness of about 0.7 mils with the surface layers contributing from about 2.5 to about 9 percent of the total weight of the film. Following coextrusion, the film laminate is biaxially oriented in a known manner and thereafter flame treated and vacuum metallized to provide the film of this invention.

Known and conventional flame treatment procedures contemplated are, for example, any of those disclosed in U.S. Pat. Nos. 2,648,097; 3,028,622; 3,255,034; 3,347,697; 3,375,126; and 4,239,827 referred to above. In a common type of flame treatment operation the surface of the oriented polyolefin film which is to be metallized is continuously passed through or in close proximity with a flame at a rate sufficient to provide an exposure time of from about 0.0005 to about 0.1 seconds. Typically, the intensity of the flame treatment is such as to impart an energy density of from about 30 to about 60 dynes/cm and preferably from about 35 to about 45 dynes/cm, to the treated side(s) of the film.

Metallization is carried out in accordance with known vacuum metallization procedures using metals such as aluminum, zinc, copper (and alloys thereof such as bronze), silver, gold, and the like, aluminum being preferred for its economy, especially where packaging applications are concerned. A metal layer ranging in thickness from about 100 to about 500 angstroms is generally entirely suitable. The following examples are illustrative of the metallization process and metallized polyolefin film of the present invention.

EXAMPLE 1

A highly crystalline polypropylene homopolymer (melting point of about 160° C.) core layer is coextruded with a metal-receiving upper surface layer of the same polypropylene and a lower surface of heat sealable resin comprising ethylenepropylene copolymer containing 0.4 weight percent anti-blocking agents and 800 ppm erucamide and 100 ppm oleamide slip agents.

The coextrudate was quenched at 80°-110° F., reheated to 240°-280° F., and stretched in the machine direction 4-8 times using transport rolls operating at different speeds. After the desired machine direction orientation, the film was transversely oriented 7-10 times, at an appropriate temperature profile, in a tenter frame.

The homopolymer polypropylene had a melt flow of 4.2 and a DSC melting point about 162° C. The resulting film had an overall thickness of 0.80 mil with the core layer 0.63 mil, the top layer 0.03 mil and the bottom layer 0.14 mil. Subsequently, the upper surface layer was flame treated to various treatment levels.

The film was metallized by vacuum deposition of aluminum and tested for metal pick off by SCOTCH 610 tape (3M Corp.). To test the metal adhesion, strips of SCOTCH 610 tape were applied to the metallized surface. The tape was pulled manually. At extreme testing conditions, the tape pull test was repeated three times with fresh tape applied to the same area. The percent of metal pick-off was recorded for comparison. Flame treatment samples with 33-40 dyne/cm treatment levels showed good metal adhesion after three SCOTCH 610 tape pull tests. Table 1 shows the effect of various levels of flame treatment on the extend of metal pick-off.

TABLE 1

| % Metal Pick-Off At Various Levels of Flame Treatment | |
|---|---|
| Treatment (dynes/cm) | % Metal Pick-off |
| 33 | 30–50 |
| 34 | 20–40 |
| 36 | 20–50 |
| 38 | 15–50 |
| 40 | 40–5 |

EXAMPLE 2

The procedure of Example 1 was substantially repeated except that the upper surface layer of the stretched film was treated by corona discharge at various levels.

Table 2 shows the effect of corona discharge treatment on the percentage of metal lift-off. At nearly every level of flame treatment carries out in Example 1, the resulting metallized film demonstrated significantly superior metal adhesion than the corona discharge treated film of this example.

TABLE 2

| % Metal Pick-Up At Various Levels Of Corona Discharge Treatment | |
|---|---|
| Treatment (dynes/cm) | % Metal Pick-Off |
| 32 | 80–90 |
| 35 | 70–90 |
| 37 | 80–95 |
| 39 | 70–90 |

EXAMPLES 3-10

Example 1 was substantially repeated with a variety of metal-receiving surface layer compositions. The flame treatment in each example was 38–40 dynes/cm. To test for the percent of observed metal fracture, the metallized multilayer film was laminated to another oriented polypropylene film employing a polyethylene adhesive. The polyethylene was cast at a 617°–620° F. stock temperature at 10 #/ream poly weight on the metallized film and subsequently laminated to the other oriented polypropylene substrate by a nip. The laminate was microscopically examined for metal fracture, a phenomenon which appears as the crazing of the metal.

The result of the metal fracture study are summarized in the following Table:

TABLE 3

| Metal Fracture Observed With Various Metallized Substrates | | | |
|---|---|---|---|
| COMPOSITION OF METALLIZED LAYER OR FILM | | | |
| EXAMPLE | RESIN NO. 1 | RESIN NO. 2 | RESIN NO. 3 | METAL FRACTURE |
| 3 | 100 | — | — | None |
| 4 | 66 | 17 | 17 | None |
| 5 | 50 | — | 50 | None |
| 6 | 66 | 34 | — | None |
| 7 | 50 | 25 | 25 | None |
| 8 | 50 | 50 | — | 18% |
| 9 | — | 100 | — | 18% |
| 10 | — | — | 100 | 9.0% |

RESIN NO. 1 = wt. parts highly crystalline polypropylene homopolymer having a xylene soluble content of about 3–4.5 wt. percent
RESIN NO. 2 = wt. parts amorphous ethylene-propylene copolymer
RESIN NO. 3 = wt. parts essentially amorphous crystalline homopolymer having a xylene soluble content of about 10–17 wt. percent.

As these data show, metal-receiving film surfaces based on at least 50 weight percent homopolymer containing an average xylene soluble content of not more than about 10 weight percent (Examples 3, 4, 5, 6 and 7) exhibited essentially no metal fracture. However, when the amount of homopolymer was less than 50 weight percent (Examples 8 and 9) or exceeded the foregoing average xylene soluble content (Example 10), an unacceptable level of metal fracture was observed.

Thus, while there have been described what are presently believed to be the preferred embodiments of the present invention, other and further modifications and changes may be made without departing from the true spirit of the invention, and it is intended to claim all such changes and modifications which come within the true scope of the invention.

What is claimed:

1. A metallized flexible polymeric film comprising:
   at least one metal-receiving layer possessing a glossy metal-receiving, polyolefin surface treated by exposure to flame prior to metallization to significantly enhance the adhesion of subsequently applied metal to said surface, said polyolefin containing at least about 50 weight percent of a substantially isotactic homopolymer and possessing an average xylene soluble content of not more than about 10 weight percent.

2. The metallized film of claim 1 which further comprises a core layer having two sides, the first side of which is in direct contact with said metal-receiving layer, on the side of said metal-receiving layer not adhered to said metal layer.

3. The metallized film of claim 2 which further comprises a heat sealable layer in direct contact with the second side of said core layer.

4. The metallized film of claim 1 wherein said substantially isotactic homopolymer is polypropylene which has a degree of atacticity of not more than about 6%.

5. The metallized film of claim 4 wherein said metal-receiving layer further comprises a second substantially isotactic hompolymer having a degree of atacticity of from about 6% to about 15%, said second homopolymer present in an amount up to about 50% by weight of said metal-receiving layer.

6. The metallized film of claim 1 wherein said metal-receiving layer further comprises a $C_2$–$C_4$ polymer which promotes adhesion of the metal to the surface of said metal-receiving layer, said adhesion promoting component included in an amount of not more than about 34% by weight of said metal-receiving layer.

7. The metallized film of claim 6 wherein said $C_2$–$C_4$ polymer includes homo-, co- and terpolymers of $C_2$–$C_4$ carbon chains.

8. The metallized film of claim 1 wherein said metal-receiving layer further comprises
   a $C_2$–$C_4$ polymer which promotes adhesion of the metal to the surface of said metal-receiving layer, said adhesion-promoting component included in an amdount of not more than about 34% by weight of said metal-receiving layer,
   a second substantially isotactic homopolymer having a degree of atacticity of from about 6% to about 15%, provided that said at least one substantially isotactic homopolymer is present in an amount of at least about 50% by weight.

9. A metallized film prepared by a process for metallizing a flexible polymeric film comprising:
   (a) providing at least one polyolefin metal-receiving layer having at least 50 percent by weight of one substantially isotactic polymer having a degree of atacticity of no more than about 6%;
   (b) treating the metal-receiving polyolefin surface by exposure to flame to significantly enhance the adhesion of subsequently applied metal to the surface; and
   (c) applying metal to the flame treated metal-receiving film surface under vacuum metallizing conditions.

10. The metallized film of claim 9, wherein said polyolefin metal-receiving layer further comprises:
- a $C_2$–$C_4$ polymer which promotes adhesion of metal to the surface by said metal-receiving layer, said adhesion-promoting component is included in an amount up to about 34% by weight of said layer.
- a second substantially isotactic polymer having a degree of atacticity of from about 6% to about 15%, provided that said at least one substantially isotactic polymer is present in an amount of at least about 50% by weight.

11. The metallized film of claim 9, wherein the polymeric film is a multilayer film structure in which the metal-receiving polyolefin layer constitutes the upper layer of the structure, substantially crystalline polypropylene homopolymer constitutes the core layer of the structure and a heat sealable resin constitutes the lower layer of the structure.

12. The metallized film of claim 9, wherein the polymeric film is oriented by stretching prior to step (b) and (c).

13. The metallized film of claim 9, wherein flame treating of the metal-receiving polyolefin film surface imparts an energy density of from about 30 to about 60 dynes/cm to this

14. The metallized film of claim 9, wherein the metal film is aluminum.

* * * * *